(12) United States Patent
Johnson

(10) Patent No.: US 11,380,971 B2
(45) Date of Patent: Jul. 5, 2022

(54) TUNABLE POWER ABSORBING TERMINATION FOR A WAVEGUIDE TRANSMISSION LINE

(71) Applicant: Ray M. Johnson, Shady Cove, OR (US)

(72) Inventor: Ray M. Johnson, Shady Cove, OR (US)

(*) Notice: Subject to any disclaimer, the term of this patent is extended or adjusted under 35 U.S.C. 154(b) by 0 days.

(21) Appl. No.: 17/114,422

(22) Filed: Dec. 7, 2020

(65) Prior Publication Data

US 2021/0175591 A1 Jun. 10, 2021

Related U.S. Application Data

(60) Provisional application No. 62/944,719, filed on Dec. 6, 2019.

(51) Int. Cl.
| | |
|---|---|
| *H01P 1/26* | (2006.01) |
| *H01P 1/24* | (2006.01) |
| *H05K 7/20* | (2006.01) |
| *H01P 3/12* | (2006.01) |

(52) U.S. Cl.
CPC ............... *H01P 1/24* (2013.01); *H01P 1/262* (2013.01); *H01P 3/12* (2013.01); *H05K 7/20* (2013.01)

(58) Field of Classification Search
CPC .. H01P 1/262; H01P 1/264; H01P 1/24; H01P 1/26; H01P 1/22; H01P 1/222; H01P 1/207; H01P 3/00; H01P 3/12; H05K 7/20
USPC .................. 333/22 F, 22 R, 81 B, 209, 208
See application file for complete search history.

(56) References Cited

U.S. PATENT DOCUMENTS

| | | | |
|---|---|---|---|
| 2,863,128 | A | 12/1958 | Gilchrist et al. |
| 2,874,326 | A | 2/1959 | Christofilos et al. |
| 2,881,399 | A | 4/1959 | Leyton |
| 3,040,252 | A | 6/1962 | Novak |
| 3,147,451 | A | 9/1964 | Merdinian |
| 3,241,089 | A | 3/1966 | Treen |
| 3,597,708 | A | 8/1971 | Perreault |
| 3,624,566 | A | 11/1971 | Perreault |
| 3,634,784 | A | 1/1972 | Lesyk et al. |
| 4,516,088 | A | 5/1985 | Johnson et al. |
| 5,910,754 | A | 6/1999 | Simpson et al. |
| 7,283,014 | B2 | 10/2007 | Johnson |

*Primary Examiner* — Stephen E. Jones
(74) *Attorney, Agent, or Firm* — Beeson Skinner Beverly, LLP

(57) ABSTRACT

A tunable power absorbing termination for a waveguide transmission line includes a section of waveguide having a front power feed end, a back power extracting end, and guidewalls extending between the front and back end thereof. A coolant circulating dielectric taper extends into the section of waveguide in an inclined orientation relative to a guidewall of the section of waveguide such that the point end of the taper extends substantially to the front power feed end of the waveguide section. The inclined orientation of the dielectric taper creates a free volume of space adjacent the taper behind the front power feed end of the waveguide section into which a tuner element is introduced which is position adjustable within the free volume of space to provide the power absorbing termination with a tuning capability.

12 Claims, 4 Drawing Sheets

TUNABLE POWER ABSORBING TERMINATION FOR A WAVEGUIDE TRANSMISSION LINE

CROSS-REFERENCE TO RELATED APPLICATIONS

This application claims the benefit of U.S. Provisional Patent Application No. 62/944,719 filed Dec. 6, 2019, which is incorporated herein by reference.

BACKGROUND

The present invention generally relates to microwave systems and more specifically to tuner devices used to correct for impedance mismatches within a microwave circuit. The invention has particular application with respect to waveguide circulators used to isolate a microwave power source from its load.

Self-excited microwave oscillators, such as magnetrons, are used as microwave power sources in a variety of applications. Because these sources are sensitive to being destabilized by reflected power, three port circulators are commonly inserted between the load and power source. The circulator provides a waveguide path for the microwave power generated by, for example, a magnetron, to be delivered to the load while diverting any power reflected by the load into a separate waveguide path terminated by a separate power absorbing load, typically a water load. In perfect conditions, none of the reflected power diverted into the water load would reach the magnetron and destabilize it. But conditions in a microwave circuit are often imperfect, resulting in mismatches that, unless dealt with, cause destabilizing power reflections that arrive at the power source. Where oscillators, such as magnetrons, are used as a power source, failure to "tune" onto the resonant cavity that exists between the magnetron and water load placed on the circulator will allow the magnetron frequency to drift with untoward effects on the ability of the microwave system to deliver power to its primary load, such as an accelerator.

To account for such mismatches, tuner devices have been devised that can be inserted into the waveguide circuit for countering the mismatches that do occur. One such tuning device is the CPR284 ball tuner offered by EM Design, LLC. In this tuning device, a position adjustable tuning element (a ball) is supported in a waveguide flange having an enlarged thickness that must be inserted into a waveguide circuit, resulting in an increase in the overall length of the circuit. This may be difficult to accomplish where the circulator and loads are situated in tight spaces, such as cancer radiation machines or other medical equipment employing microwave accelerators; it can be particularly difficult and costly to retrofit existing equipment with such devices.

The present invention overcomes the difficulties presented by existing microwave circuit tuning devices by providing a power absorbing waveguide termination, such as normally used to terminate the power absorbing arm of a circulator, having an internal tuning capability. The tunable power absorbing waveguide termination of the invention eliminates the need to insert additional waveguide components into a waveguide circuit to achieve system tuning capabilities and greatly simplifies the retrofitting of existing microwave equipment where the need exists. Power absorbing terminations in accordance with the invention can be easily tuned to maximize the power absorbed by the load in dynamic conditions and to achieve maximum protection of upstream microwave power sources that are sensitive to reflected power.

SUMMARY OF INVENTION

The invention is directed to a tunable power absorbing termination for a waveguide transmission line. The tunable power absorbing termination of the invention includes a section of waveguide having a front power feed end, a back power extracting end, and guidewalls extending between the front and back end thereof. A coolant circulating dielectric taper extends into the section of waveguide in an inclined orientation relative to a guidewall of the section of waveguide such that the point end of the taper extends substantially to the front power feed end of the waveguide section. The inclined orientation of the dielectric taper creates a free volume of space adjacent the taper behind the front power feed end of the waveguide section. A position adjustable tuner element is introduced into this free volume of space to provide the power absorbing termination with a tuning capability.

DESCRIPTION OF THE ILLUSTRATED EMBODIMENT

Figure 1:
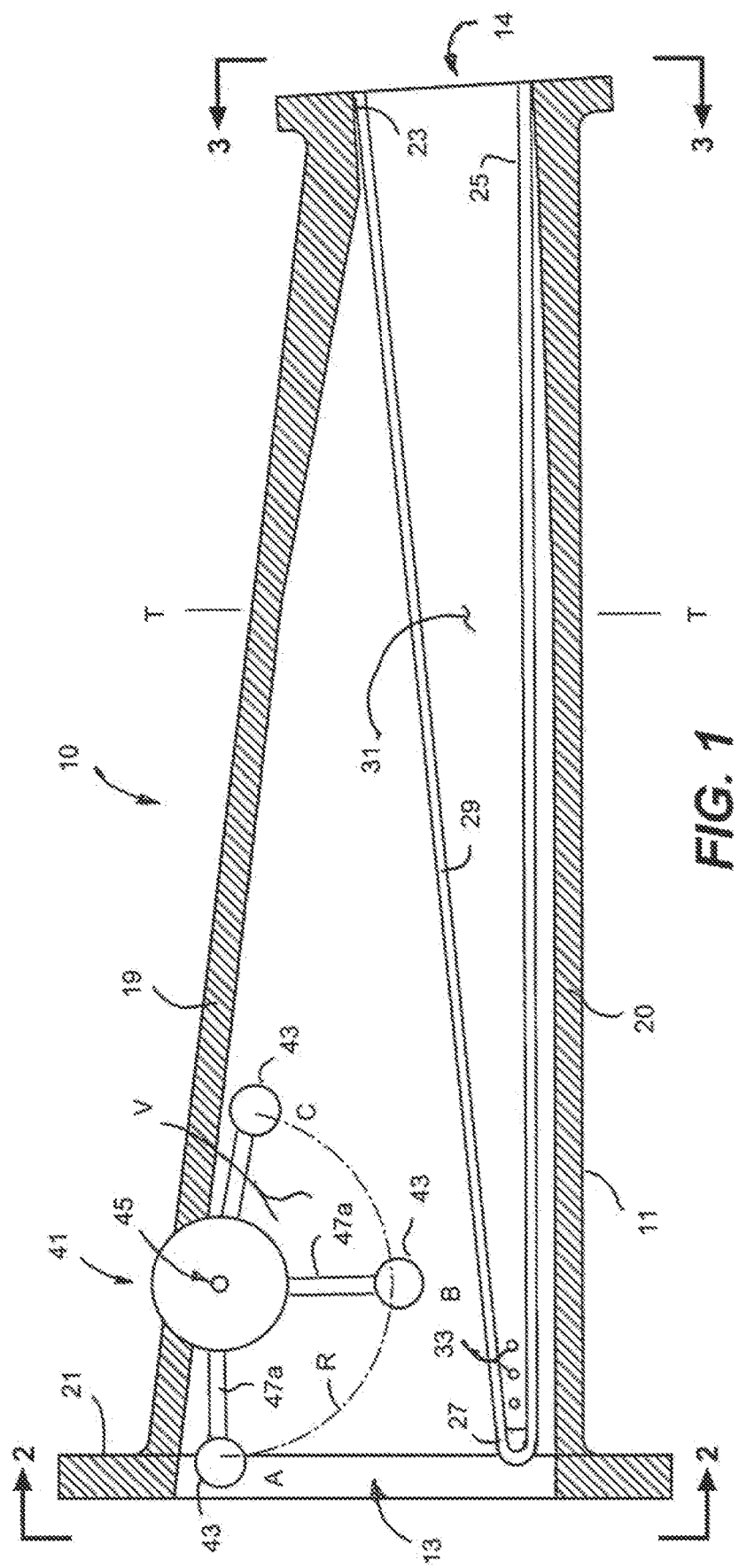
FIG. 1 is a top plan, cross-sectional view of a tunable power absorbing termination for a waveguide transmission line in accordance with the invention showing a dielectric taper in the section of waveguide and different rotated positions for the tuner element of the power absorbing termination.
Figure 3:
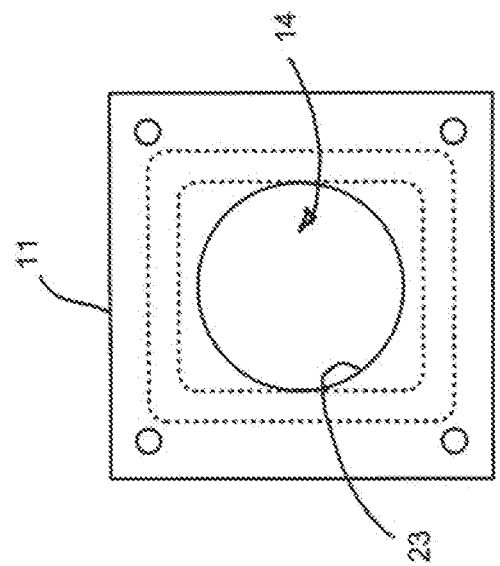
FIG. 3 is a right end elevational view thereof without the dielectric taper.
Figure 2:
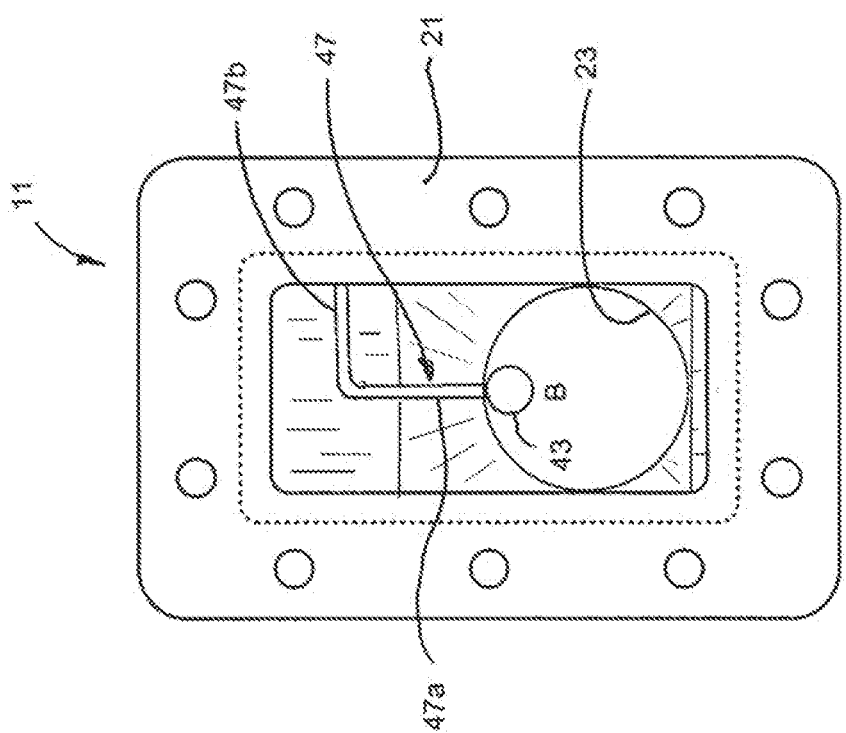
FIG. 2 is a left end elevational view thereof without the dielectric taper showing the tuner element of the termination's tuner mechanism in a center rotated position.

It is noted that "waveguide" is frequently referred to herein as simply a "guide." These terms are interchangeable.

Referring now to the drawings, a power absorbing termination, generally denoted by the number 10 and sometimes referred to herein as "water load," is comprised of a section of waveguide 11 having a forward power feed end 13 for receiving microwave power propagated down a waveguide transmission line (not shown), and a back end 14 though which power is extracted from the water load. Power is absorbed and extracted from the load by circulating water through a dielectric taper 15 strategically deployed within the load.

At its power feed end, waveguide section 11 is seen to have a generally rectangular shape as defined by the waveguide section's broadwalls 17, 18 and its narrow sidewalls 19, 20. The flange 21 at the power feed end is used to attach the water load to the flange at the end of a correspondingly sized rectangular waveguide transmission line, for example a WR284 waveguide.

The waveguide section 11 is seen to transition from a full sized rectangular guide at its power feed end 13 to a relatively small circular back opening 23 at its back end 14. Initially, the transition is a gradual transition from a full sized rectangular guide at the guide's feed end to a reduced in size rectangular guide at a point along the guide's length denoted by the letter "T" in FIG. 1. At this point, the width of the waveguide as defined by the distance between its narrow guidewalls 19, 20 is somewhat reduced, but not the height of the guide as defined by the distance between its broadwalls 17, 18. The cross-sectional area of the guide up to point T remains relatively large. However, after point T the guide's cross-sectional area rapidly diminishes. Maintaining the largest possible cross-sectional area as the waveguide section progresses toward the back end of the guide section provides an ample volume of space, denoted in the drawings by the letter "V," for the effective deployment of a tuning mechanism in this region of the guide as later described.

As the waveguide section progresses from point T toward the back end of the guide, it transitions from a rectangular cross-section to a circular cross-section having a cross-sectional area that is relatively small compared to the cross-sectional area of the guide at point T. The water carrying dielectric taper 15 is configured such that, when inserted through the back opening 23 of waveguide section 11, the base end 25 of the taper fits snugly into the back opening while its tapered body extends substantially all the way through the waveguide section against the guide's narrow wall 20. Because the taper's point end 27 has a relatively small cross-section compared to its base end, it leaves a relatively large volume of free occupiable space in the guide behind the guide's power feed end. This free space can be advantageously used for tuning mechanism such as hereinafter described.

The water load's dielectric taper can be configured as described in U.S. Pat. No. 4,516,088 to Ray M. Johnson, the entirety of which is incorporated herein by reference. As described therein the taper can be in the form of a thin-walled hollow dielectric cone 29 with a divider wall 31 running from the base end of the taper to near the taper's point end to create a circulation path for circulating water (or other coolant) through the taper. Water introduced into base end of the divided taper is forced under pressure down one side of the taper, around and through openings 33 in the taper's point end and back up the other side of the taper whereupon it is extracted from the load. As discussed in U.S. Pat. No. 4,516,088, the positioning of the taper against the narrow wall of the guide section of the water load reduces the effect of the taper on incoming power, that is, it produces minimal reflected power. This is due to the field configurations for the fundamental mode in a rectangular waveguide, which is the TE10 rectangular mode. This mode has only one component of electric field represented by electric field vectors extending between the broadwalls of the guide. The field vectors of the TE10 mode diminish to zero at the guide's side walls from a maximum field strength at the center of guide. Thus, for the TE10 mode the point end of the taper will lie in a region of minimal electric field strengths and will have minimal effect on the incoming microwave power.

In accordance with the invention, a tuning mechanism is incorporated directly into the above-described water load so that it is an integral part of the water load. This integral tuning capability greatly facilitates the configuration of microwave systems where a tuning capability is desired, and particularly where space is at premium. The integral tuning mechanism, denoted by the numeral 41 in the drawings, is comprised of a metal tuner element 43, most suitably a ball shaped element or "tuner ball" made of brass having a diameter of about ⅜ inches, deployed in the free occupiable volume of space V adjacent the dielectric taper. As above-described, this free volume of space is situated behind the front power feed end of the waveguide section, and in the illustrated embodiment is seen to extend approximately from the waveguide section's power feed end 13 rearwardly toward the transition point T of the waveguide section. To provide a tuning capability the tuning element must be adjustable within this free volume of space between regions of different electric field strengths for the waveguide mode of the microwave power delivered to the water load. Preferably, the position to which the tuning element can be adjusted will include positions within the waveguide section that place the tuner element in a region of maximum or near maximum electric field strength to a position of minimum or near minimum electric field strength within the free volume of space.

In the illustrated embodiment of the invention, tuning mechanism 41 provides for a rotational adjustment of the tuner ball 43. As best seen in FIG. 1, the pivot point 45 of the rotation is located next to the angled narrow guidewall 19 of the waveguide section 11 opposite the point end of taper 15. The tuner's pivot location is displaced behind the feed end 13 of the waveguide section such that the tuner element can be rotated to a forward position (position A shown in FIG. 1) that is still substantially within the free occupiable volume of space V of the waveguide section. In this forward position, the tuner element is positioned proximate guidewall 19, which for the TE10 rectangular waveguide mode will be a position of near minimum electric field strength. From this forward position the tuner element can be rotated through an arc (denoted by the "R") of approximately 180 degrees to any position along the rotation arc. In the position denoted B in FIG. 1, the tuner element extends out into the guide midway between the guide's narrow sidewalls 19, 20. In this position, the tuner element will be in a region of the guide where the electric field strength for the TE10 rectangular waveguide mode is at a maximum or near maximum. Continuing the rotation, the tuner element can be rotated behind the pivot point until it again is positioned near the guidewall 19 in a region of minimum field strength (position C in FIG. 1). By rotating the tuner to different positions along this rotation arc, the water load can be tuned onto a microwave power source, such as a magnetron, that is sensitive to power reflections.

In the illustrated tuner mechanism, the tuner element is affixed to the end of a thin bendable pivot rod 47, which is preferably a stainless steel rod, and which suitably could be a length of 1/16 inch diameter welding rod. The free end 49 of the bendable rod is inserted through a predrilled hole 51 in the top broadwall 17 of the waveguide section 11, which is located at the pivot point 45. A mounting boss 53 having a center bore for accommodating an extension of the pivot rod is affixed to broadwall 17 over the pivot point. This mounting boss supports a clamping connector 55 through which the free end of the pivot rod is also inserted. The clamping is configured to allow the pivot rod to be rotated within the connector when the connector is loosened, and to fix the rotational position of the pivot rod when the connector is tightened. By loosening the connector, the tuner element at the opposite end of the pivot rod can be rotated to a position that achieves a desired match with the microwave power source. An example of a clamping connector that can be used for this purpose is a brass Swagelock® tub fitting male connector, part no. B-100-1-2. The connector will preferably be capable of providing a sealing closure when tightened to seal gas in the guide and prevent leakage of electromagnetic energy through the tuner mechanism.

It is noted that in the illustrated embodiment, mounting boss 53 is shown as a separate part that is affixed to the top wall of waveguide section 11 opposite the dielectric taper. Suitably, the boss will seat within a counterbored recess 57 in the guide's top wall and be brazed in place. The boss could, for example, be cut from a one inch diameter brass rod and drilled to provide a mounting boss one inch in diameter and between about ¼ and ½ inch in height. However, it will be appreciated that a mounting boss of other configurations and dimensions suitable for supporting a clamping connector could be provided and that the mounting boss could be machined directly into the top wall of the load's waveguide section rather than being a separate part that must be affixed to the top wall of the waveguide section.

Figure 4A:
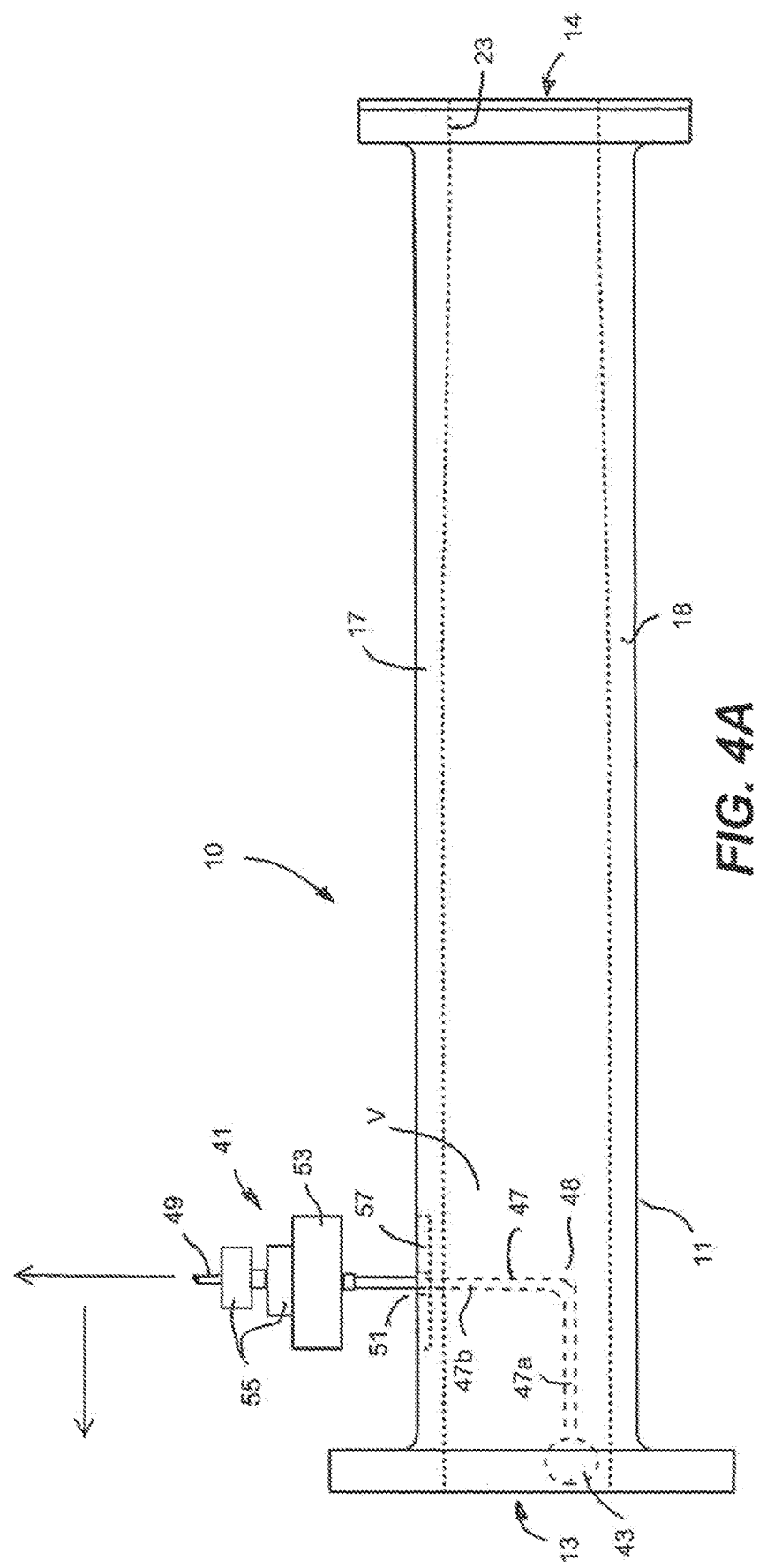
FIG. 4A is an exploded view thereof in side elevation without the dielectric taper illustrating the installation of the installation's tuner mechanism.
Figure 4B:
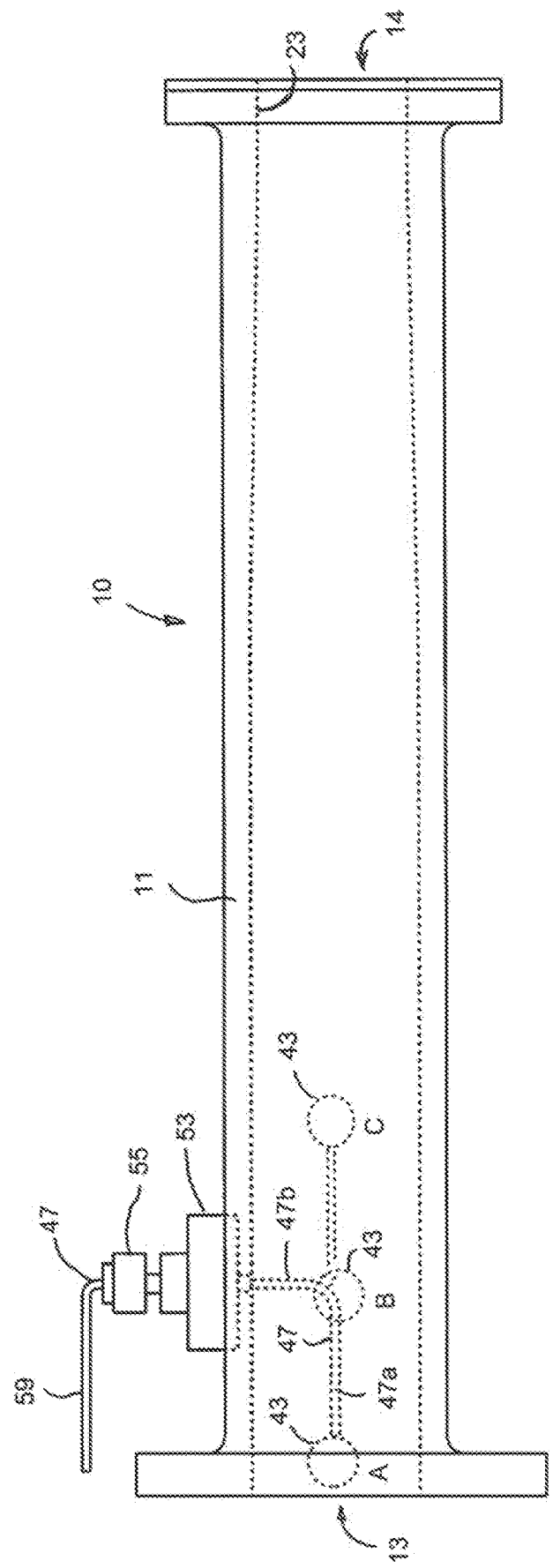
FIG. 4B is a side elevational view thereof without the dielectric taper showing the termination's tuner mechanism installed on the broadwall of the termination's waveguide section.

As best shown in FIG. 4A, to install the tuner mechanism, the free end 49 of the bendable pivot rod 47, with tuner ball attached to the opposition end, can be guided by hand through the power feed end of the guide and up through the center hole (not shown) of mounting boss 53 and then on through the loosened clamping connector 55. The pivot rod is pushed up through the boss and clamping connector until the tuner ball at the opposite end of the pivot rod is properly positioned within the front region of the waveguide section behind the power feed end of the guide. In order to obtain a proper placement of the tuner ball in the guide, the pivot rod will need to be bent at a suitable point 48 and most suitably at a ninety degree angle as shown in FIGS. 4A and 4B, creating two segments of the pivot rod, a horizontal segment 47a for the tuner ball and vertical segment 47b which extends upwardly above the bend 48 through the mounting boss and clamping connector. This configuration will allow the tuner ball at the end of the horizontal segment of the pivot rod to be rotated though a rotation arc within the guide section as above-described by rotating the vertical segment of the pivot rod. The length of the pivot rod's horizontal segment 47a is preferably set such that the rotation arc for the tuner ball will place the tuner ball at the center or near center of the guide as shown in FIG. 1 when the tuner ball is rotated to the "B" position. Similarly, the degree to which the vertical part of the pivot rod is pushed up through the mounting boss and clamping connector has indicated by the vertical arrow in FIG. 4A) is preferably such that the rotation arc of the tuner ball is in a plane that is approximately midway between the two broadwalls of the waveguide.

Finally, it is noted that the vertical part of the pivot rod is preferably of sufficient length that it can be bent over above the clamping connector 53 (as indicated by the horizontal arrow in FIG. 4A) to form a horizontal handle portion 59 of the pivot rod 47 that is easily gripped and turned to facilitate the rotation of the tuner ball. The bend can be made close to the top of the clamping connector to avoid introducing a protruding structure into the space above the water load that could obstruct adjacent equipment within the waveguide system on which the water load is used.

While a particular embodiment of the invention has been described in detail in the foregoing specification and the accompanying drawings, it is not intended that the invention be limited to such detail. It will be appreciated by persons of ordinary skill in the art that implementations of the invention other than described are possible that are within the spirit and scope of the invention, including the substitution of materials and the use of structures functionally equivalent to those described.

I claim:

1. A tunable power absorbing termination for a waveguide transmission line comprising:
a section of waveguide having a power feed front end, a power extraction back end, and guidewalls extending behind the front end thereof toward the back end thereof,
a coolant circulating dielectric taper having a base end and a point end, the base end of the dielectric taper being engaged in the back end of the waveguide section such that the dielectric taper extends into the section of waveguide in an inclined orientation toward a guidewall of the section of waveguide, and such that the point end of the taper extends substantially to the front power feed end of the waveguide section, a free volume of space being provided adjacent the dielectric taper behind the front power feed end of the waveguide section,
a tuner element disposed in the free volume of space adjacent the dielectric taper behind the front power feed end of the waveguide section, the position of the tuner element being adjustable within the free volume of space adjacent the dielectric taper between regions of the free volume of space having different electric field strengths.

2. The tunable power absorbing termination of claim 1 wherein the tuner element is adjustable within the free volume of space between regions of maximum and minimum electric field strength.

3. The tunable power absorbing termination of claim 1 wherein the tuner element is adjustable through a rotation arc within the free volume of space that extends between positions that are proximate a guidewall of the section of waveguide and that sweeps into a region within the free volume of space midway between opposite guidewalls of the section of waveguide.

4. The tunable power absorbing termination of claim 1 wherein the tuner element is adjustable within the free volume of space through a rotation arc of approximately 180 degrees.

5. The tunable power absorbing termination of claim 1 wherein the power feed end of the section of waveguide is in the form of a rectangular waveguide and wherein the rectangular form of the section of waveguide maintains a rectangular form over at least a portion of the free space behind the front power feed end of the waveguide section.

6. The tunable power absorbing termination of claim 5 wherein the rectangular form of the waveguide behind the front power feed end of the waveguide section is defined by opposed broadwalls and narrow walls and wherein the tuning element is adjustable in a plane lying approximately midway between the broadwalls of the rectangular waveguide form.

7. The tunable power absorbing termination of claim 1 wherein the tuner element is part of a tuning mechanism accessible from outside of the section of waveguide.

8. The tunable power absorbing termination of claim 7 wherein the tuning mechanism is comprised of a pivot rod having two ends, and wherein the tuning element is attached to one end of the pivot rod and the opposite end of the pivot rod extends through a broadwall of the section of waveguide opposite the dielectric taper, and further wherein the pivot rod can be rotated from outside the waveguide section to adjust the position of the tuning element inside the free space behind the front power feed end of the waveguide section.

9. A tunable power absorbing termination for a waveguide transmission line comprising:
- a section of waveguide having a power feed front end and a power extraction back end, and guidewalls extending behind the front end thereof toward the back end thereof, the front end of the section of waveguide having a rectangular form such that the guidewalls extending behind the front end of the section of waveguide are comprised of opposed broad guidewalls and opposed narrow guidewalls,
- a coolant circulating dielectric taper having a coolant feed base end and a point end, the coolant feed base end of the dielectric taper being engaged in the back end of the waveguide section such that the dielectric taper extends into the section of waveguide in an inclined orientation toward a narrow guidewall of the section of waveguide and such that the point end of the taper extends substantially to the front power feed end of the waveguide section, a free volume of space being provided adjacent the dielectric taper behind the front power feed end of the waveguide section,
- a tuner element disposed in the free volume of space behind the front power feed end of the waveguide section, the position of the tuner element being adjustable within the free volume of space through a rotation arc centered on a pivot axis located proximate the narrow wall of the narrow guidewall opposite the narrow guidewall toward which the dielectric taper is inclined.

10. The tunable power absorbing termination of claim 9 wherein the tuner element is adjustable about the pivot axis through a rotation arc that extends into a region within the free volume of space midway between the opposite narrow guidewalls that extend behind the front end of the section of waveguide.

11. The tunable power absorbing termination of claim 9 wherein the tuner element is part of a tuning mechanism accessible from outside of the section of waveguide.

12. The tunable power absorbing termination of claim 11 wherein the tuner mechanism is comprised of a bent pivot rod having two segments, one segment of which carries the tuner element and the other segment of which extends along the pivot axis through the broad guidewall that extends behind the front end of the section of waveguide.

* * * * *